United States Patent
Naumann et al.

(10) Patent No.: US 11,085,347 B2
(45) Date of Patent: Aug. 10, 2021

(54) DRIVE UNIT FOR A MOTOR VEHICLE HAVING A COMBINED ARRANGEMENT OF A CYCLIC PROCESS DEVICE AND A THERMOELECTRIC GENERATOR

(71) Applicant: Volkswagen Aktiengesellschaft, Wolfsburg (DE)

(72) Inventors: Hardy Naumann, Wolfsburg (DE); Asmus Carstensen, Osloss (DE); Artur Semke, Wolfsburg (DE)

(73) Assignee: Volkswagen Aktiengesellschaft, Wolfsburg (DE)

( * ) Notice: Subject to any disclaimer, the term of this patent is extended or adjusted under 35 U.S.C. 154(b) by 0 days.

(21) Appl. No.: 16/786,666

(22) Filed: Feb. 10, 2020

(65) Prior Publication Data

US 2020/0256237 A1 Aug. 13, 2020

(30) Foreign Application Priority Data

Feb. 8, 2019 (DE) ...................... 10 2019 201 685.5

(51) Int. Cl.
*F01N 5/02* (2006.01)
*F01K 23/06* (2006.01)
(Continued)

(52) U.S. Cl.
CPC ............ *F01N 5/025* (2013.01); *F01K 23/065* (2013.01); *F01K 23/10* (2013.01); *F01P 3/20* (2013.01);
(Continued)

(58) Field of Classification Search
CPC . F01N 5/025; F02G 5/02; F01K 23/10; F01K 23/065; F01P 3/20
See application file for complete search history.

(56) References Cited

U.S. PATENT DOCUMENTS 6,598,405 B2 * 7/2003 Bell ........................ F02G 1/043
62/3.3
8,919,123 B2 12/2014 Gibble et al.
(Continued)

FOREIGN PATENT DOCUMENTS

DE 10 2008 019 160 A1 10/2009
DE 10 2009 020 421 A1 11/2010
(Continued)

OTHER PUBLICATIONS

DE-102010048888-A1 English Translation (Year: 2012).*

*Primary Examiner* — Shafiq Mian
(74) *Attorney, Agent, or Firm* — Muncy, Geissler, Olds & Lowe, P.C.

(57) ABSTRACT

A drive unit for a motor vehicle that includes an internal combustion engine, which has a combustion engine and an exhaust gas line, via which exhaust gas can be removed from the combustion engine. A cyclic process device is provided for converting the thermal energy of the exhaust gas into mechanical work in a thermodynamic cyclic process, wherein a working medium with respect to its direction of flow flows through a first heat exchange device, in which a heat transfer from the exhaust gas to the working medium takes place, then flows through an expansion device, in which an expansion of the working medium and thereby the generation of the mechanical work take place, and then flows through a second heat exchange device, in which a heat transfer from the working medium to a cooling medium takes place.

16 Claims, 5 Drawing Sheets

(51) Int. Cl.
   *F01K 23/10*   (2006.01)
   *F01P 3/20*   (2006.01)
   *F02G 5/02*   (2006.01)
   *H01L 35/30*   (2006.01)
   *F01P 3/00*   (2006.01)

(52) U.S. Cl.
   CPC .............. *F02G 5/02* (2013.01); *H01L 35/30*
   (2013.01); *F01P 2003/001* (2013.01)

(56) References Cited

U.S. PATENT DOCUMENTS

| | | | |
|---|---|---|---|
| 9,163,545 B2 | 10/2015 | Resch et al. | |
| 2008/0289335 A1* | 11/2008 | Drysdale | F01D 15/005 |
| | | | 60/649 |
| 2010/0236595 A1* | 9/2010 | Bell | H01L 35/30 |
| | | | 136/205 |
| 2011/0067742 A1 | 3/2011 | Bell et al. | |
| 2011/0259008 A1 | 10/2011 | Ternel | |
| 2013/0133321 A1 | 5/2013 | Ringler et al. | |
| 2013/0219872 A1* | 8/2013 | Gibble | F02N 19/10 |
| | | | 60/320 |
| 2017/0082000 A1* | 3/2017 | Borla | F01N 5/025 |

FOREIGN PATENT DOCUMENTS

| | | | | |
|---|---|---|---|---|
| DE | 10 2010 038 314 A1 | 1/2012 | | |
| DE | 10 2010 048 887 A1 | 4/2012 | | |
| DE | 10 2010 048 888 A1 | 4/2012 | | |
| DE | 102010048888 A1 * | 4/2012 | ........... | F01K 23/065 |
| DE | 10 2012 206 085 A1 | 10/2013 | | |
| DE | 10 2013 009 912 A1 | 12/2014 | | |
| DE | 10 2014 001 819 A1 | 8/2015 | | |
| DE | 10 2014 015 457 A1 | 4/2016 | | |
| FR | 2 959 272 B1 | 7/2013 | | |
| KR | 10-2017-0076220 A | 7/2017 | | |
| RU | 2 566 207 C2 | 10/2015 | | |

* cited by examiner

DRIVE UNIT FOR A MOTOR VEHICLE HAVING A COMBINED ARRANGEMENT OF A CYCLIC PROCESS DEVICE AND A THERMOELECTRIC GENERATOR

This nonprovisional application claims priority under 35 U.S.C. § 119(a) to German Patent Application No. 10 2019 201 685.5, which was filed in Germany on Feb. 8, 2019, and which is herein incorporated by reference

BACKGROUND OF THE INVENTION

Field of the Invention

The present invention relates to a drive unit for a motor vehicle and to a motor vehicle having such a drive unit.

Description of the Background Art

Motor vehicles are often powered by combustion engines in which fuel is burned and the thermal energy released thereby is partially converted into mechanical work. The efficiency of reciprocating combustion engines, which are used almost exclusively for driving motor vehicles, is, when averaged, about one third of the primary energy used. Accordingly, two-thirds of the thermal energy released during combustion represents waste heat, which is discharged into the environment as heat loss either via a cooling system of the motor vehicle or exhausted by the exhaust gas line.

Utilization of this waste heat represents a possibility for increasing the overall efficiency of a motor vehicle drive unit and thus reducing fuel consumption.

A steam cyclic process device or a thermoelectric generator is known for utilizing the waste heat of a combustion engine, wherein waste heat from the exhaust gas of the combustion engine can be used in particular by means of these devices (cf. DE 10 2014 015 457 A1 or DE 10 2014 001 819 A1).

In this regard, DE 10 2010 048 887 A1 discloses a combined use of a steam cyclic process device and a thermoelectric generator for utilizing the waste heat from a combustion engine. In this regard, the thermoelectric generator is connected to the cyclic process device in a heat-conducting manner via a cooling fluid line. This enables waste heat from the steam cyclic process device to be partially used in the thermoelectric generator by conversion into electrical energy.

SUMMARY OF THE INVENTION

It is therefore an object of the present invention to provide a better utilization of waste heat from a combustion engine of a motor vehicle.

According to an exemplary embodiment of the invention, a drive unit for a motor vehicle and a motor vehicle having such a drive unit are provided, wherein the drive unit has an internal combustion engine, on the one part, which comprises a combustion engine and an exhaust gas line via which exhaust gas can be removed from the combustion engine.

Further, the drive unit has a cyclic process device which is designed to convert the thermal energy of the exhaust gas into mechanical work in a (clockwise) thermodynamic cyclic process, wherein a working medium with respect to its flow direction flows through a first heat exchange device in which a (direct or indirect) heat transfer from the exhaust gas to the working medium takes place, as a result of which the temperature and/or the pressure of the working medium are increased. The working medium then flows through an expansion device in which an expansion of the working medium and thereby the generation of the mechanical work take place. Thereupon the working medium in addition flows through a second heat exchange device in which a (direct or indirect) heat transfer from the working medium to a cooling medium takes place.

A drive unit of the invention also comprises a thermoelectric generator (TEG) which is designed to convert thermal energy of the exhaust gas into electrical energy and which for this purpose provides an electrical voltage when there is a temperature difference between its high-temperature side and its low-temperature side. For this purpose, the TEG comprises, in a known manner, at least one thermocouple, usually a plurality of thermocouples, in which, according to the thermoelectric effect (also called the "Seebeck effect"), there is an electric voltage in a circuit, formed from two different electrical conductors, at a temperature difference between the contact points of these electrical conductors. The electrical conductors in this case can preferably be made of metals and in particular of semiconductors. Such TEGs enable a direct conversion of thermal energy into electrical energy. In order to sustainably provide the temperature difference, which is required for the functionality of a TEG, between the contact points of the electrical conductors, such a TEG accordingly comprises a first heat exchanger, connected in a heat-conducting manner to one end of the electrical conductors, hereinafter referred to as the high-temperature side of the TEG, by means of which a relatively high temperature of these ends of the electrical conductors is established by means of a specific heat transfer, as well as a second heat exchanger, connected to the other end of the electrical conductors, hereinafter referred to as the low-temperature side of the TEG, in which a relatively low temperature for the corresponding ends of the electrical conductors is established by specific heat dissipation or cooling.

According to the invention, such a drive unit is characterized by an integration of the TEG into the cyclic process device such that the working medium is or can also be passed over it. As a result, a thermal coupling of the cyclic process device and the TEG can be realized in a particularly advantageous manner, which has a positive effect with regard to the overall efficiency of the waste heat utilization and/or with regard to the structural and spatial combination of these two devices.

The exhaust gas, the waste heat of which is to be used, can in particular be such an exhaust gas that is at least partially, preferably completely, provided for discharging into the environment.

The cyclic process device can be a steam cyclic process device, which is designed in particular to carry out a cyclic process and in particular a Clausius-Rankine cycle, and in which the working medium in the liquid state undergoes a pressure increase by means of a pump, is then vaporized and preferably overheated in the first heat exchange device, and is condensed in the second heat exchange device.

The cooling medium which is used at least in the second heat exchange device of the cyclic process device for dissipating thermal energy can be a cooling liquid which circulates in a cooling system of the internal combustion engine and in particular in an engine cooling circuit of this cooling system, said circuit comprising at least one cooling channel of the combustion engine. This enables, among other things, the waste heat from the cyclic process, which can represent a large part (e.g., approximately 85%) of the thermal energy supplied, to be dissipated in a simple manner to the ambient air via a cooling liquid cooler of the cooling system. Alternatively or in addition, it can also be provided to use ambient air to cool the working medium by means of the second heat exchange device.

An integration of the TEG into the cyclic process device can be provided such that the cooling medium, which is used for heat dissipation in the second heat exchange device of the cyclic process device, is/can be passed likewise over the low-temperature side of the TEG in order to cool it. In addition or alternatively, however, cooling of the low-temperature side of the thermoelectric generator can also be provided by means of a coolant, in particular a gas, which is different from the cooling medium, then particularly preferably by means of specifically supplied ambient air. As a result, a relatively large temperature difference between the high-temperature side and the low-temperature side of the thermoelectric generator can optionally be realized. This applies in particular if the alternatively or additionally used coolant has a lower fluid temperature compared with the coolant.

The working medium can be passed over the high-temperature side of the TEG. The low-temperature side of the thermoelectric generator can then be cooled in particular by means of a coolant which differs from the working medium, in particular by means of the coolant also used for cooling in the second heat exchange device of the cyclic process device and/or by means of the specifically supplied ambient air. Such an embodiment of a drive unit of the invention is based in particular on utilizing a still relatively high temperature of the working medium in order to realize a greatest possible temperature difference between the high-temperature side and the low-temperature side of the TEG. For this purpose, the TEG or the high-temperature side thereof can preferably be arranged either downstream of the expansion device and upstream of the second heat exchange device or downstream of the first heat exchange device and upstream of the expansion device with respect to the flow direction of the working medium, or can be integrated into the circuit for the working medium of the cyclic process device.

The first of these alternative arrangements is based on the assumption that the temperature of the working medium, even after the expansion device, is still sufficiently high to generate an advantageously high temperature difference between the high-temperature side and the low-temperature side for the TEG. At the same time, cooling and in particular condensation of the working medium in the second heat exchange device of the cyclic process device can be practically limited. By arranging the TEG downstream of the expansion device and upstream of the second heat exchange device, it brings about an additional cooling capacity for the working medium and thus provides support for the second heat exchange device, as a result of which overall sufficient cooling and in particular condensation of the working medium in the second heat exchange device can be achieved even with a relatively small dimensioning of the second heat exchange device.

The second of these alternative arrangements of the TEG or its high-temperature side can be provided in particular when a design in terms of performance of the expansion device is made not on the basis of a maximum heat flow to be expected during operation of the drive unit, which can be transferred to the working medium in the first heat exchange device of the cyclic process device, but on the basis of a lower (by comparison), in particular average, heat flow, as a result of which an overall better efficiency of the cyclic process device can be realized across all operating states of the drive unit. The TEG can then in particular also be used to utilize the excess heat output by means of the TEG when the drive unit is operated with a heat flow that is greater than that for which the expansion device is designed, so that it is possible to dispense with, for example, the shutting down of the output of the cyclic process device to avoid overloading the expansion device. A further advantage of this second arrangement of the TEG can be the still relatively high temperature of the working medium when flowing over the high-temperature side of the TEG and thus a correspondingly high temperature difference between this high-temperature side compared with the low-temperature side. This is advantageous with regard to the electrical power provided by the TEG.

According to an embodiment of a drive unit of the invention, it can also be provided that the working medium can be passed through the low-temperature side of the TEG. This can serve, in particular, to advantageously utilize a heat flow, which was carried over as a result of cooling the low-temperature side of the TEG by means of the working medium of the cyclic process device, for carrying out a cyclic process by means of the cyclic process device. For this purpose, it can be particularly preferably provided that the TEG or its low-temperature side is arranged downstream of the second heat exchange device and upstream of the first heat exchange device with respect to the flow direction of the working medium. In this case, the working medium would therefore be preheated by means of the TEG before entering the first heat exchange device and thus a support power would be provided for this first heat exchange device. As a result, a relatively high useful power generated by the cyclic process device can be realized. At the same time, a relatively high useful power can be generated using the TEG. For this purpose, it can furthermore preferably also be provided that the exhaust gas flows directly to and/or through the high-temperature side of the TEG in order to realize a highest possible temperature difference between the high-temperature side and the low-temperature side of the TEG.

The first heat exchange device and the TEG can be formed integrated in a heat exchange unit. As a result, the drive unit can be realized in as compact a design as possible.

For such an integral design, it can in particular be provided that in the heat exchange unit, a working medium channel of the first heat exchange device, said channel which is provided for the throughflow of the working medium, is arranged between an exhaust channel provided for the throughflow of the exhaust gas, on the one hand, and the high-temperature side of the TEG, on the other. The working medium flowing into the working medium channel can thereby serve as a heat damper for the high-temperature side of the TEG, whereby it can be protected against temporary temperature peaks of the exhaust gas, which can be harmful for its durability.

Such a heat exchange unit can be designed in a structurally advantageous manner in that the working medium channel surrounds the exhaust gas channel circumferentially and the high-temperature side of the thermoelectric generator surrounds or limits the working medium channel circumferentially. It can further preferably be provided that the low-temperature side and in particular a cooling channel thereof, which is provided for the throughflow of a coolant, surrounds the high-temperature side of the TEG circumferentially.

A motor vehicle of the invention can be, in particular, a wheel-based and not a rail-bound motor vehicle, preferably a passenger car or truck. In this regard, at least the internal combustion engine of the drive unit of the invention of the motor vehicle can be envisaged preferably for directly or indirectly providing the drive power for the motor vehicle.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
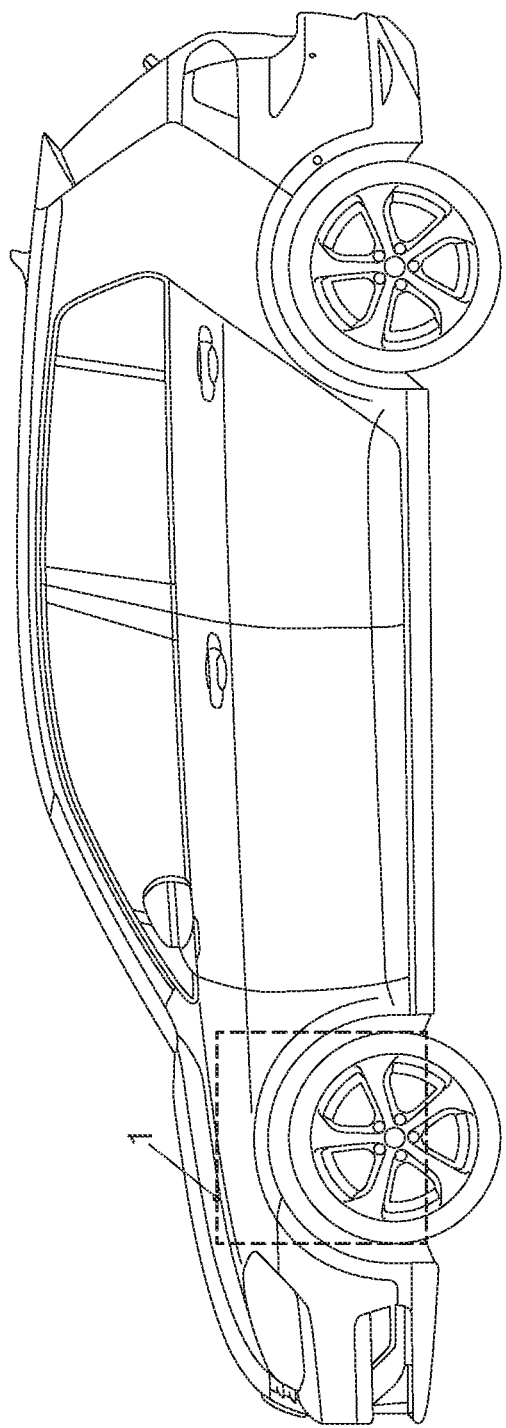
FIG. 1 illustrates a motor vehicle with a drive unit of the invention.

FIG. 1 shows a vehicle (of the invention) having a drive unit of the invention. This drive unit 1 can be designed, for example, according to one of the embodiments shown in FIGS. 2 to 5.

The drive units 1 shown in FIGS. 2 to 5 each comprise an internal combustion engine with a combustion engine 2, which is designed, for example, as a diesel or gasoline engine. One or more combustion chambers 3, in which fresh gas (air) is burned with fuel during the operation of combustion engine 2, are formed in combustion engine 2. In so doing, the fresh gas is supplied to combustion engine 2 via a fresh gas line. Exhaust gas arising during the combustion of the fresh gas with the fuel is removed from combustion engine 2 via an exhaust gas line 4 and introduced into the environment. In this regard, the exhaust gas flows through a first heat exchange device 5 of a cyclic process device, which is specifically designed as a steam cyclic process device.

The exhaust gas, on the one hand, and a working medium 10 of the cyclic process device, on the other, (separated from one another) flow through first heat exchange device 5, wherein heat transfer from the exhaust gas to the working medium takes place. This heat transfer leads to evaporation and overheating of working medium 10 in first heat exchange device 5 designed as an evaporator. In a clockwise cyclic process, the superheated steam can then be expanded in an expansion device 6, whereby mechanical power is generated, which in turn can be used to generate electrical energy by means of a generator 7. In a second heat exchange device 8 of the cyclic process device, which serves as a condenser, working medium 10 is then cooled and converted back into the liquid phase. A pump 9 of the cyclic process device ensures that liquid working medium 10 is fed again to first heat exchange device (evaporator) 5 in order to close the circuit of working medium 10 in the cyclic process device.

In addition to working medium 10, a cooling medium 11, for example, a cooling liquid which flows in an engine cooling circuit of a cooling system 12 of the internal combustion engine, also flows (separated from one another) through second heat exchange device (condenser) 8, wherein a heat transfer from working medium 10 to cooling medium 11 takes place during the execution of the cyclic process by means of the cyclic process device.

The drive units according to FIGS. 2 to 5 each also comprise a thermoelectric generator (TEG) 13, which is integrated into the cyclic process device such that working medium 10 is also passed over it. This is done in order to influence or to generate and maintain a temperature difference between the sides of thermoelectric generator 13 by means of a heat transfer between working medium 10 and either a high-temperature side 14 or a low-temperature side 15 of thermoelectric generator 13. As a result, TEG 13 can be used to generate a useful electrical power which can be fed, for example, into an on-board network of the drive unit or into an on-board network of a motor vehicle comprising the drive unit. The specific types of integration of TEG 13 into the particular cyclic process device differ in drive units 1 according to FIGS. 2 to 5.

Figure 2:
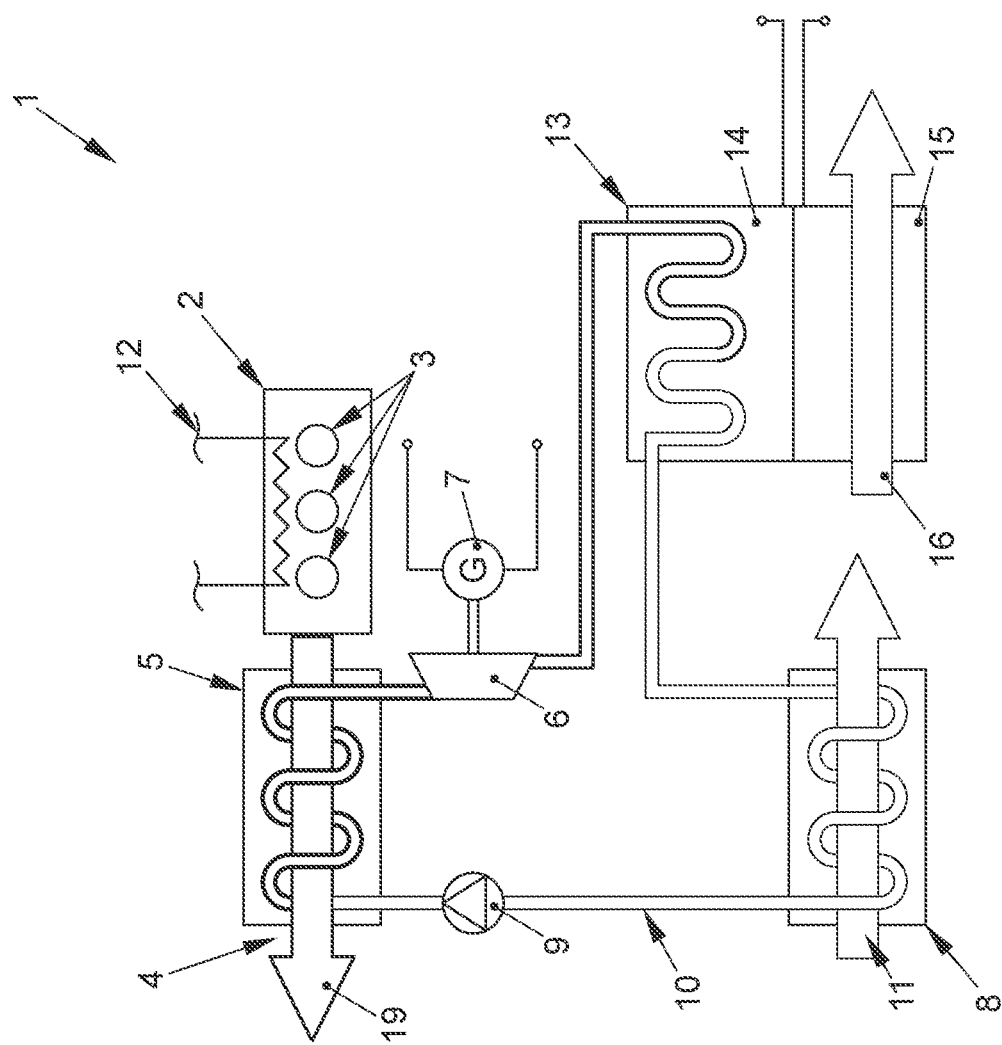
FIG. 2 illustrates a drive unit of the invention according to an exemplary embodiment.

In drive unit 1 according to FIG. 2 it is provided that working medium 10 is passed over high-temperature side 14 of TEG 13. In this regard, TEG 13 or high-temperature side 14 thereof is arranged downstream of expansion device 6 and upstream of second heat exchange device (condenser) 8 with respect to the provided flow direction of working medium 10 in the cyclic process device. In addition to the use of waste heat from the cyclic process device for generating useful electrical power by means of TEG 13, this arrangement has the advantage that TEG 13 precools working medium 10 to be fed subsequently to second heat exchange device (condenser) 8 and thereby supports condensation of working medium 10 in second heat exchange device (condenser) 8. This can be particularly advantageous if the cooling medium used to cool working medium 10 in second heat exchange device (condenser) 8 is a cooling liquid which flows in an engine cooling circuit of a cooling system 12 of the internal combustion engine and which therefore regularly has a relatively high fluid temperature, which can be accompanied by a relatively low cooling capacity of this second heat exchange device (condenser) 8.

Coolant 16 which flows through and/or around low-temperature side 15 of TEG 13 can preferably be a coolant 16 different from the cooling fluid of cooling system 12, for example, ambient air supplied specifically for cooling low-temperature side 15 of TEG 13. This coolant 16 can thus advantageously have a relatively low fluid temperature in comparison with the cooling liquid of cooling system 12, which can lead to a greatest possible temperature difference between high-temperature side 14 and low-temperature side 15 of TEG 13 and thus to a highest possible useful electrical power that can be generated by means of TEG 13.

Figure 3:
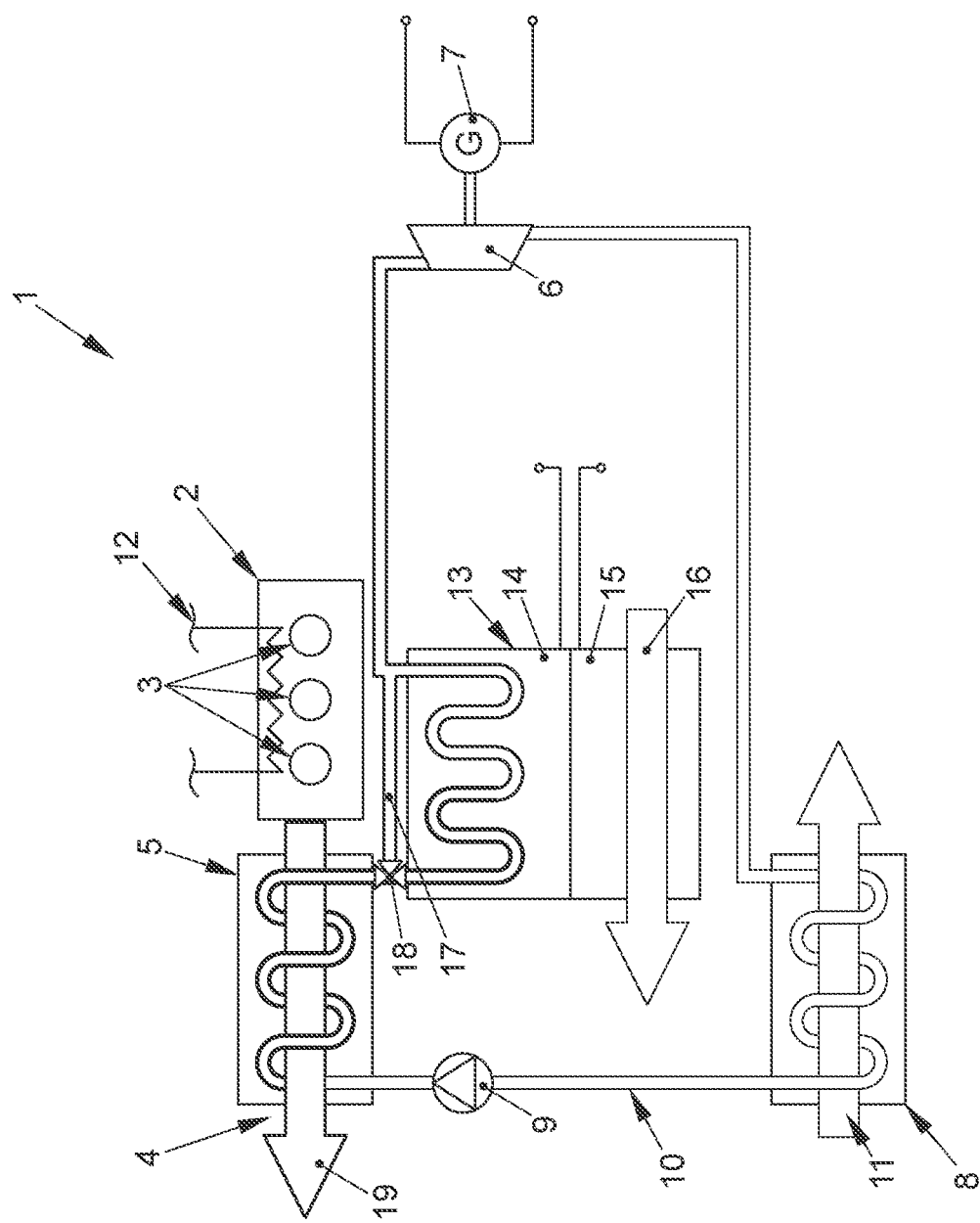
FIG. 3 illustrates a drive unit of the invention according to an exemplary embodiment.

Drive unit 1 shown in FIG. 3 differs from that according to FIG. 2 only in the arrangement of TEG 13. In this case, high-temperature side 14 of TEG 13, said side through which working medium 10 of the cyclic process device flows, is arranged downstream of first heat exchange device (evaporator) 5 and upstream of expansion device 6 with respect to the flow direction of working medium 10. Firstly, this arrangement has the advantage that working medium 10 passed through high-temperature side 14 of TEG 13 has a relatively high temperature, which results in a correspondingly high temperature difference between high-temperature side 14 and low-temperature side 15 of TEG 13 and, consequently, in a correspondingly high useful power that can be generated by means of TEG 13. Further, it can be achieved by this arrangement of TEG 13 that temporarily relatively high temperatures of working medium 10, which result from a correspondingly high exhaust gas heat supply, which results, for example, from the operation of combustion engine 2 with high and in particular maximum loads and speeds, are reduced by TEG 13 before working medium 10 reaches expansion device 6. This can be particularly advantageous if expansion device 6 is designed for a highest possible efficiency with a rather average exhaust gas heat supply. Such a design of expansion device 6 or the entire cyclic process device can be advantageous because combustion engines which are provided for driving motor vehicles are usually used most of the time in a part load operation, so that it can be expedient to design the cyclic process device such that it achieves a highest possible efficiency in an exhaust gas heat supply made available in such a part load operation.

In particular with this drive unit 1 according to FIG. 3, it can be expedient to temporarily at least partially prevent flow through high-pressure side 14 of TEG 13 by at least partially conveying working medium 10 to TEG 13 via a bypass 17. This can be set by means of an appropriate control valve 18. As a result, the amount of thermal energy of working medium 10 which is used in TEG 13 to generate useful electrical power and which is therefore no longer available for use in expansion device 6 can be controlled as needed.

Coolant 16 which flows through and/or around low-temperature side 15 of TEG 13 can again preferably be a coolant 16 different from the cooling fluid of cooling system 12, for example, specifically supplied ambient air. This coolant 16 can advantageously have a relatively lower fluid temperature in comparison with the cooling liquid of cooling system 12, which can lead to a greatest possible temperature difference between high-temperature side 14 and low-temperature side 15 and thus to a highest possible useful electrical power that can be generated by means of TEG 13.

Figure 4:
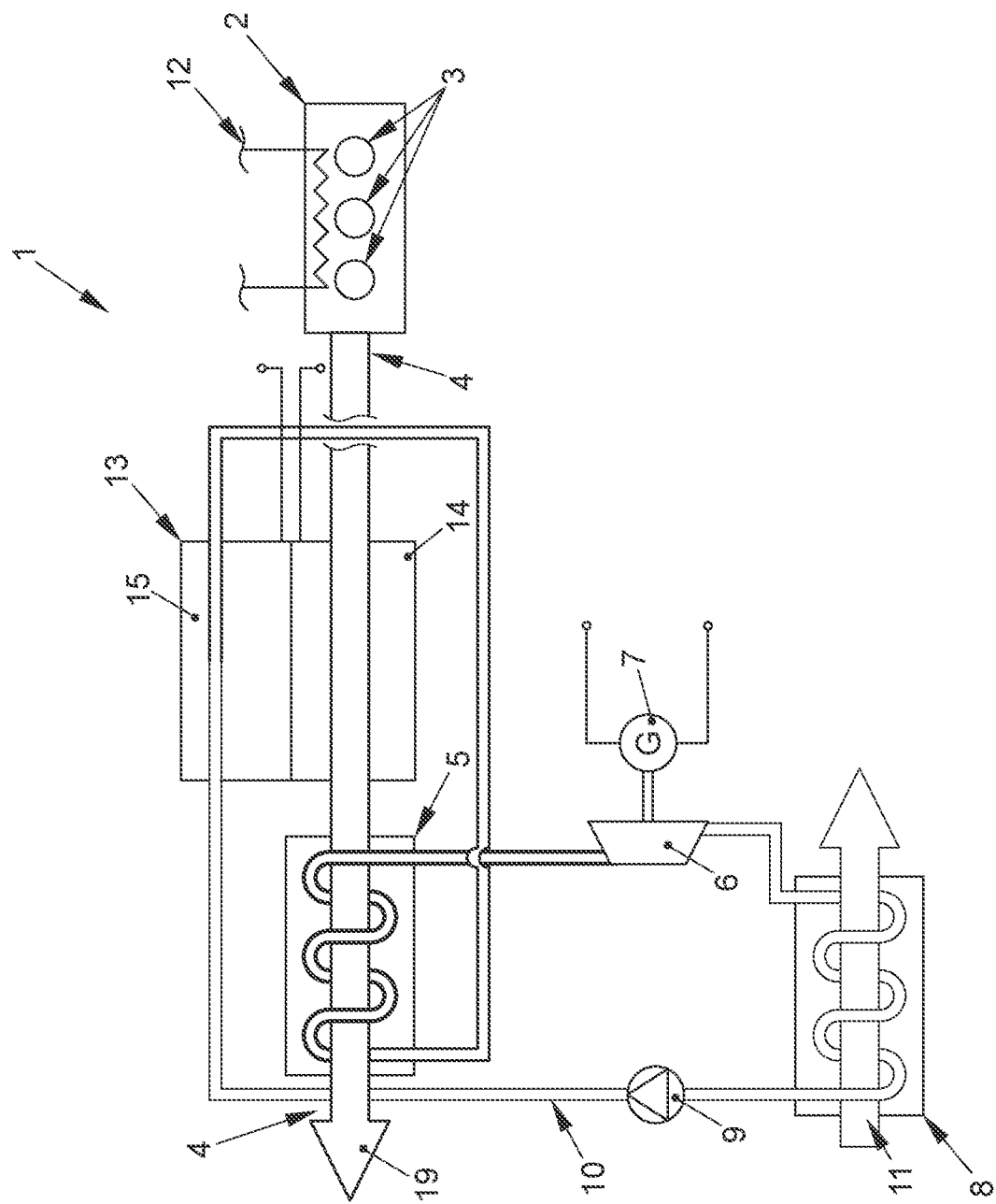
FIG. 4 illustrates a drive unit of the invention according to an exemplary embodiment.

In drive unit 1 according to FIG. 4, working medium 10 of the cyclic process device is passed over low-temperature side 15 of TEG 13. In contrast, exhaust gas 19 flows directly through and/or around high-temperature side 14 of TEG 13. This takes place before exhaust gas 19 flows through first heat exchange device (evaporator) 5 of the cyclic process device. In one respect, this leads to a relatively high temperature on high-temperature side 14 of TEG 13 and thus to a correspondingly high temperature difference between high-temperature side 14 and low-temperature side 15. The useful power that can be achieved by means of TEG 13 can therefore be correspondingly high. At the same time, thermal energy that is transferred to working medium 10 in low-temperature side 15 of TEG 13 can advantageously be used to preheat working medium 10 before it enters first heat exchange device (evaporator) 5 of the cyclic process device. Accordingly, it is provided according to FIG. 4 that TEG 13 or its low-temperature side 15 is integrated in the circuit of the cyclic process device in an arrangement downstream of second heat exchange device (condenser) 8 and upstream of first heat exchange device (evaporator) 5.

Figure 6:
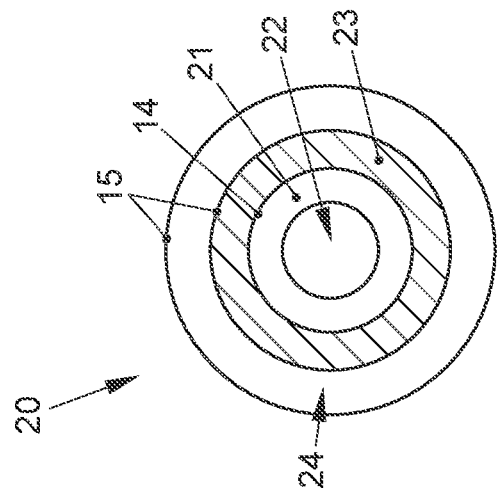
FIG. 6 illustrates a cross section through a heat exchange unit for a drive unit according to FIG. 5.
Figure 5:
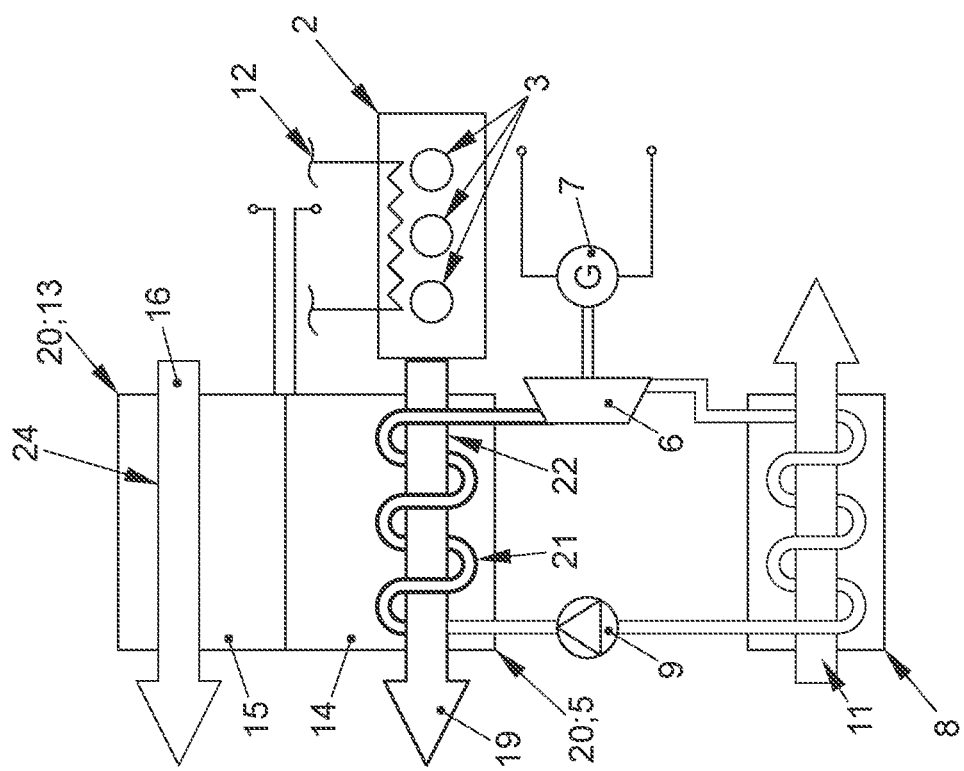
FIG. 5 illustrates a drive unit of the invention according to an exemplary embodiment.

In the drive unit according to FIG. 5, an integral design of first heat exchange device (evaporator) 5 of the cyclic process device and of TEG 13 is provided in a heat exchange unit 20, in which a working medium channel 21 of first heat exchange device (evaporator) 5, said channel which is provided for the throughflow of working medium 10, is arranged between an exhaust gas channel 22 provided for the throughflow of exhaust gas 19, on the one hand, and high-temperature side 14 of TEG 13, on the other hand. It can be provided specifically for this purpose according to FIG. 6 that exhaust gas channel 22 is surrounded circumferentially by the annular working medium channel 21. In this regard, working medium channel 21 is limited on the outside or circumferentially by high-temperature side 14 of TEG 13. High-temperature side 14 is in turn surrounded circumferentially by low-temperature side 15 of TEG 13, wherein a plurality of thermocouples 23, which are connected in series to form a thermal chain, structurally connect high-temperature side 14 and low-temperature side 15 of TEG 13. Low-temperature side 15 of the TEG can optionally comprise a coolant channel 24, which can also have an annular design and through which a coolant 16 for cooling low-temperature side 15 of TEG 13 can be passed.

Coolant 16 which in drive unit 1 according to FIG. 5 flows through and/or around low-temperature side 15 of TEG 13 can again preferably be a coolant 16 different from the cooling fluid of cooling system 12, for example, specifically supplied ambient air.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A drive unit for a motor vehicle, the drive unit comprising:
   an internal combustion engine, which comprises a combustion engine and an exhaust gas line, via which exhaust gas is adapted to be removed from the combustion engine;
   a cyclic process device to convert thermal energy of the exhaust gas into mechanical work in a thermodynamic cyclic process, the cyclic process device having a working medium with respect to its direction of flow which flows through a first heat exchange device, in which a first heat transfer from the exhaust gas to the working medium takes place, then flows through an expansion device, in which an expansion of the working medium and thereby the generation of the mechanical work takes place, and then flows through a second heat exchange device, in which a second heat transfer from the working medium to a cooling medium takes place; and
   a thermoelectric generator which provides an electrical voltage when there is a temperature difference between a high-temperature side and a low-temperature side,
   wherein the working medium of the cyclic process device flows through the high-temperature side in a first configuration or the low-temperature side of the thermoelectric generator in a second configuration,
   wherein, in the first configuration, the low-temperature side of the thermoelectric generator is cooled by the cooling medium or ambient air, and
   wherein, in the second configuration, the high-temperature side of the thermoelectric generator is heated directly by the exhaust gas.

2. The drive unit according to claim 1, wherein the cooling medium flows through the low-temperature side of the thermoelectric generator.

3. The drive unit according to claim 1, wherein the cooling medium is a cooling liquid of a cooling system of the combustion engine.

4. The drive unit according to claim 1, further comprising a bypass for the working medium for bypassing the thermoelectric generator as needed.

5. The drive unit according to claim 1, wherein, in the first configuration, the thermoelectric generator is arranged downstream of the expansion device and upstream of the second heat exchange device with respect to the flow direction of the working medium.

6. The drive unit according to claim 1, wherein, in the first configuration, the thermoelectric generator is arranged downstream of the first heat exchange device and upstream of the expansion device with respect to the flow direction of the working medium.

7. The drive unit according to claim 5, wherein the working medium flows through the high-temperature side of the thermoelectric generator, the thermoelectric generator providing additional cooling capacity for the working medium, the second heat exchange device being a condenser.

8. The drive unit according to claim 1, wherein, in the second configuration, the thermoelectric generator is arranged downstream of the second heat exchange device and upstream of the first heat exchange device with respect to the flow direction of the working medium.

9. The drive unit according to claim 8, wherein the working medium flows through the low-temperature side of the thermoelectric generator.

10. The drive unit according to claim 1, wherein the first heat exchange device and the thermoelectric generator are integrated in a heat exchange unit.

11. The drive unit according to claim 10, wherein in the heat exchange unit a working medium channel of the first heat exchange device is provided a throughflow of the working medium and is arranged between an exhaust gas channel provided for the throughflow of the exhaust gas and the high-temperature side of the thermoelectric generator.

12. The drive unit according to claim 11, wherein the working medium channel surrounds the exhaust gas channel circumferentially and the high-temperature side of the thermoelectric generator surrounds the working medium channel circumferentially.

13. A drive unit for a motor vehicle, the drive unit comprising:

an internal combustion engine, which comprises a combustion engine and an exhaust gas line, via which exhaust gas is adapted to be removed from the combustion engine;

a cyclic process device to convert thermal energy of the exhaust gas into mechanical work in a thermodynamic cyclic process, the cyclic process device having a working medium with respect to its direction of flow which flows through a first heat exchange device, in which a heat transfer from the exhaust gas to the working medium takes place, then flows through an expansion device, in which an expansion of the working medium and thereby the generation of the mechanical work takes place, and then flows through a second heat exchange device, in which a heat transfer from the working medium to a cooling medium takes place; and a thermoelectric generator which provides an electrical voltage when there is a temperature difference between a high-temperature side and a low-temperature side, wherein the working medium of the cyclic process device flows through the high-temperature side or the low-temperature side of the thermoelectric generator, wherein the first heat exchange device and the thermoelectric generator are integrated in a heat exchange unit, wherein in the heat exchange unit a working medium channel of the first heat exchange device is provided a throughflow of the working medium and is arranged between an exhaust gas channel provided for the throughflow of the exhaust gas and the high-temperature side of the thermoelectric generator, wherein the working medium channel surrounds the exhaust gas channel circumferentially and the high-temperature side of the thermoelectric generator surrounds the working medium channel circumferentially, and wherein the low-temperature side surrounds the high-temperature side of the thermoelectric generator circumferentially.

14. A motor vehicle having a drive unit according to claim 1.

15. The drive unit according to claim 1, wherein the first heat exchange device is an evaporator and the second heat exchange device is a condenser.

16. The drive unit according to claim 1, wherein the mechanical work of the expansion device is converted to electricity via a generator.

* * * * *